United States Patent [19]

Smayling et al.

[11] Patent Number: 4,823,320

[45] Date of Patent: Apr. 18, 1989

[54] ELECTRICALLY PROGRAMMABLE FUSE CIRCUIT FOR AN INTEGRATED-CIRCUIT CHIP

[75] Inventors: Michael C. Smayling, Missouri City; Sebastiano D'Arrigo, Houston, both of Tex.; Giuliano Imondi, Rieti; Sossio Vergara, Frattamaggiore, both of Italy

[73] Assignee: Texas Instruments Incorporated, Dallas, Tex.

[21] Appl. No.: 860,940

[22] Filed: May 8, 1986

[51] Int. Cl.[4] .................................................. G11C 7/00
[52] U.S. Cl. ...................................... 365/189; 365/185
[58] Field of Search ........................... 365/185, 189, 96

[56] References Cited

U.S. PATENT DOCUMENTS

| | | | |
|---|---|---|---|
| 4,404,659 | 9/1983 | Kihara et al. | 365/185 |
| 4,686,384 | 8/1987 | Harvey et al. | 365/96 |
| 4,715,014 | 12/1987 | Tuvell et al. | 365/185 |

Primary Examiner—James W. Moffitt
Attorney, Agent, or Firm—Theodore D. Lindgren; Thomas W. DeMond; Melvin Sharp

[57] ABSTRACT

A fuse circuit for an integrated circuit chip which includes a non-volatile memory element, a circuit programmer for the memory element, and a read circuit for detecting the programmed states of the memory element and providing output signal levels corresponding to the programmed states. A switch is coupled to the read circuit output and switches from an open to a closed position in response to a selected output signal level.

3 Claims, 2 Drawing Sheets

ELECTRICALLY PROGRAMMABLE FUSE CIRCUIT FOR AN INTEGRATED-CIRCUIT CHIP

BACKGROUND

The present invention relates to a fuse circuit for use on an integrated circuit chip to connect or disconnect circuit elements.

The traditional method of connecting or disconnecting circuit elements on an integrated circuit chip has been to use actual fuses such as polysilicon links blown by electrical current or laser blown links. Polysilicon links have the disadvantage of requiring removal of the protective coating on the chip over the fusable link before a reliable open-circuit fuse blow can be obtained. Laser blowing requires elaborate equipment and controls, and must be done before protecting coating is applied. Both of the foregoing processes result in the generation of slag left over from the melting process. U.S. Pat. No. 4,562,639 issued to McElroy Jan. 7, 1986 and assigned to Texas Instruments describes a thin-oxide fuse element which is programmed at a voltage below the oxide breakdown level so that small holes or perforations generated in the oxide are filled with silicon and become short circuits.

Accordingly, it is an object of the present invention to provide a fuse circuit for connecting, disconnecting or otherwise altering circuit elements on a semiconductor integrated circuit chip. It is a further object to provide a fuse which is simple and inexpensive to program, is highly reliable, and does not require any standby current.

SUMMARY OF THE INVENTION

According to the invention there is provided a fuse circuit for an integrated circuit chip which includes a non-volatile memory element, means for programming the memory element, and a read circuit for detecting the programmed states of the memory element and providing output signal levels corresponding to the programmed states. A switch is coupled to the read circuit output and switches from an open to a closed position in response to a selected output signal level.

Preferably, the memory element is an electrically programmable read only memory element. The memory element may also be electrically erasable.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
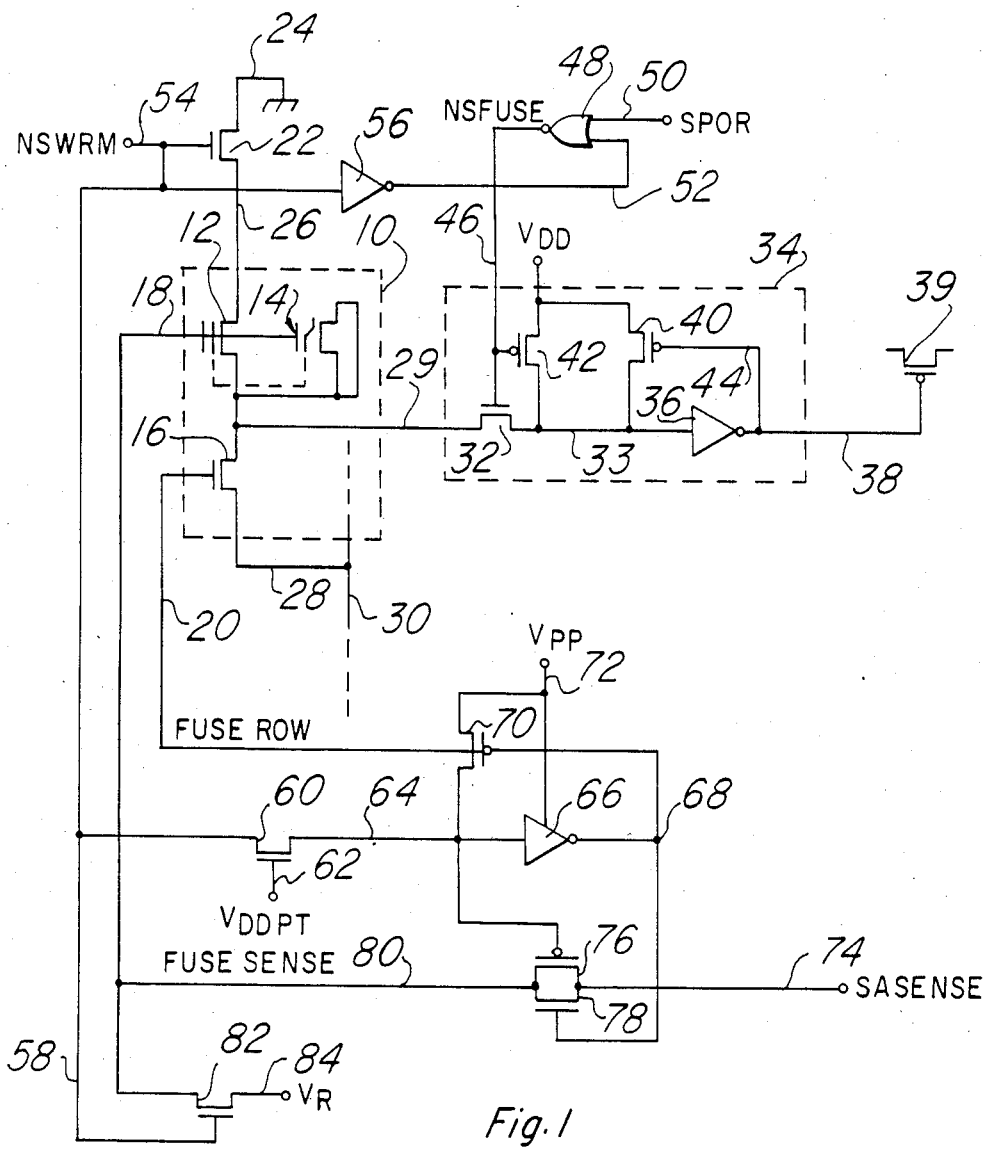
FIG. 1 is an electrical circuit diagram showing an erasable electrically programmable read only memory cell together with associated circuitry to form an electrically programmable fuse circuit.

Referring to FIG. 1, an electrically erasable, programmable read only memory cell, i.e. an EEPROM cell, 10 consists of a floating gate transistor 12 a tunnelling device 14 and a select transistor 16. The floating gate of transistor 12 is connected to a gate of a tunnelling device 14. The control gates of both the floating gate transistor 12 and the tunnelling device 14 are connected to a line 18. A source of the transistor 12 connects to a drain of select transistor 16 while a source of the latter connects to a line 28. The drain of floating gate transistor 12 connects to one end of a source to drain path of transistor 22 the other end of which connects to ground. The gate of transistor 22 connects to zero-input-active-write-mode NSWRM input line 54. With the input on the NSWRM line 54 low the fuse is placed in a write mode while in all other cases the latter signal level is high.

Line 18 connects both to a FUSESENSE line 80 for sensing fuse circuit status and to one end of a source to drain path of a transistor 82, the other end of the source to drain path of transistor 82 connecting to a reference voltage $V_R$. The gate of transistor 82 is coupled by line 58 to NSWRM line 54 and to the input of an inverter 56. The circuit for applying the voltages used to operate the EEPROM 10 consists of an inverter 66 having an input line 64 connected to one end of the source to drain path of transistor 60 the other end of which connects to line 58. The gate of transistor 60 is connected by line 62 to a $V_{DDPT}$ protected power supply of 5 volts and is always on. Inverter 66 is also coupled to a programming supply voltage $V_{pp}$ by line 72. Lines 68 and 20 are connected to each other and to the gate of second P-channel transistor 70. Coupled in parallel are P-channel transistor 76 and N-channel transistor 78 one end of the source to drain paths of which connect by FUSESENSE line 80 to line 18 and the other end of which connect to a sensing reference voltage on SASENSE line 74. SASENSE line 74 is the ordinary sense line of an array used both in WRITE and in READ mode. SASENSE line 74 is used in the execution only for write generation (both program and erase functions). The gate of P-channel transistor 76 connects to line 64 while that of N-channel transistor 78 connects to line 68 of inverter 66. The line 68 of inverter 66 also connects to a rowline for fuse circuits designated as FUSEROW line 20 which is applied to the gate of select transistor 16.

A read circuit 34 is coupled to the junction of floating gate transistor 12 and select transistor 16 by a read pass gate transistor 32 coupled at one end of its source to drain path to line 29. The pass gate transistor 32 connects at its other source to drain path end to line 33 leading to an input of inverter 36. An output of inverter 36 on line 38 is applied to the gate of a P-channel pass transistor 39. A P-channel transistor 42 has its source to drain path connected between $V_{DD}$ and line 33. The gate of the latter transistor connects to line 46 which is also applied to the gate of transistor 32. Thus, when transistor 32 is turned on transistor 42 will be turned off and vice versa. In parallel with the source to drain path of transistor 42 is another P-channel transistor 40 whose gate is coupled by line 44 to output line 38.

Select transistor 16 is coupled at another end of its source to drain path to line 28 which, in turn, connects to a column line 30. Line 30 is the ordinary column line of an array.

The NSWRM signal on line 54 is coupled through inverter 56 to line 52 which forms one input to NOR gate 48. Another input to NOR gate 48 is power on reset input SPOR on line 50.

As is well-known, EEPROM cell 10 has two programmed states, either programmed or unprogrammed. The EEPROM cell 10 is initially in an unprogrammed state in which the floating gate is uncharged. With transistor 82 conducting due to a logic 1 condition on its gate sense line 58 is at 1.25 volts and floating gate transistor 12 conducts. If, however, through SASENSE line 74 a large $V_{pp}$ of 16 volts is applied to the control gate of transistor 12 with line 26 floating, line 29 at ground and line 28 at ground because transistor 16 is on then the floating gate is charged up negatively or to a logic one state. In this state when in a read mode as described above then floating gate transistor 12 does not conduct. It is possible to erase the programmed state and return to a logic zero state in which the floating gate transistor 12 is uncharged by applying through SASENSE line 74 ground potential to the control gate on line 18 and 16 volts to the column line 30.

Initially when turning on the power a positive SPOR signal on line 50 is received and applied to NOR gate 48 which forces a zero on line 46 and turns off read pass gate 32. A low voltage applied to the gate of P-channel transistor 42 turns on the latter and applies $V_{DD}$ to line 33. A high level on line 33 results in a low output on line 38 or a logic zero. Thus, during power on transistor 32 is turned off to isolate the read circuit 34 from the EEPROM cell 10 and the read circuit output 38 is forced to zero. Once the voltage on line 38 is zero, P-channel transistor 40 is turned on maintaining the potential on line 33 at $V_{DD}$. When SPOR goes low again, and if the voltage on line 52 is at a logic zero corresponding to a read mode (NSWRM=1) then internal signal NSFUSE will be high turning on transistor 32 once again and turning off transistor 42. The turning off of transistor 42, however, does not remove $V_{DD}$ from line 33 as transistor 40 maintains line 33 at the latter potential.

After power on SPOR signal has gone low again the circuit operation mode is dictated by NSWRM signal on line 54. If a read mode is to be entered then the latter signal level will be high. Through transistor 60 this logical 1 produces a logical zero at the line 68 of the inverter 66, thereby switching off transistor 16. In this way column line 30 of the ordinary array is isolated and the operation of the array is not affected. After inversion of the NSWRM signal on line 54 by inverter 56 to produce a low level on line 52, NOR circuit 48 produces a logic 1 at its output which turns on transistor 32 and turns off transistor 42. If now the floating gate transistor 12 is unprogrammed then it will conduct current from $V_{DD}$ through transistor 40 and through the transistors 32 and 12 to line 26 which will be pulled to ground by transistor 22. Since transistor 40 is made with about 3 times the channel resistance as transistor 12 and a much higher resistance than the channel of transistor 32, most of the voltage drop occurs across transistor 40. This drops the voltage on line 33 to the point where the output of inverter 36 switches from low to high thereby turning off transistor 40 and raising the output on line 38 to a logic one level.

If instead of being unprogrammed, the floating gate transistor 12 is programmed so that it does not conduct, then under the same situation as just described, read line 28 will remain at ground potential, transistor 16 will have zero potential on its gate from line 20 and will be non-conducting allowing line 33 to remain high at $V_{DD}$ and the output of inverter 36 on line 38 to be low.

To program the floating gate transistor 12 an NSWRM signal of a low or logic zero level is applied to line 54. This results in a logic zero level on line 46 which turns off transistor 32 and isolating read line 29 from the read circuit 34. At the same time a "0" on line 58 gets transmitted through transistor 60 to line 64 and appears on line 68 as a logic 1. In this case the logic 1 corresponds to the voltage $V_{pp}$ which for a write mode is 16 volts. P-channel transistor 70 is turned off by the "1" level on line 68. At the same time a "0" on the gate of P-channel transistor 76 and a "1" on the gate of N-channel transistor 78 turn on both transistors 76 and 78 thereby applying SASENSE on line 74 (in this case equal to $V_{pp}$) to FUSESENSE line 80 and to the control gate on line 18 of floating gate transistor 12.

Once any programming that is to be effected is complete, a read mode is entered by applying a logic one to NSWRM line 54. Since line 54 is applied to the gate of transistor 22, the latter is turned on and applies ground potential to line 26. The logic one level is transmitted through transistor 60 to line 64 and after inversion by inverter 66 appears on line 68 as a logic zero. The logic one signal turns off transistor 76 while the logic zero signal on line 68 turns off transistors 78 and 16. The logic one signal on line 58 turns on transistor 82 placing $V_R$ onto line 18. The value of $V_R$ is selected to be slightly lower than the normal value of sense voltage (about 2 volts) for a floating gate transistor. A value for $V_R$ of 1.25 volts is chosen so as to minimize the degradation of the EEPROM threshold which occurs after a long time. Such a low value can be used considering the relatively few number of times that the fuse will be programmed so that no degradation results due to the effects that occur from a large number of programming operations.

It will be appreciated that in certain applications read line 28 may be coupled to the column line 30 of an array of memory cells (not shown). It will be further appreciated that it is possible to erase the charge stored on a given fuse by simply applying 16 volts to the associated column line 30 and ground potential to line 18. It is possible to do this by having SASENSE at ground and column line 30 connected to ground.

Figure 2:
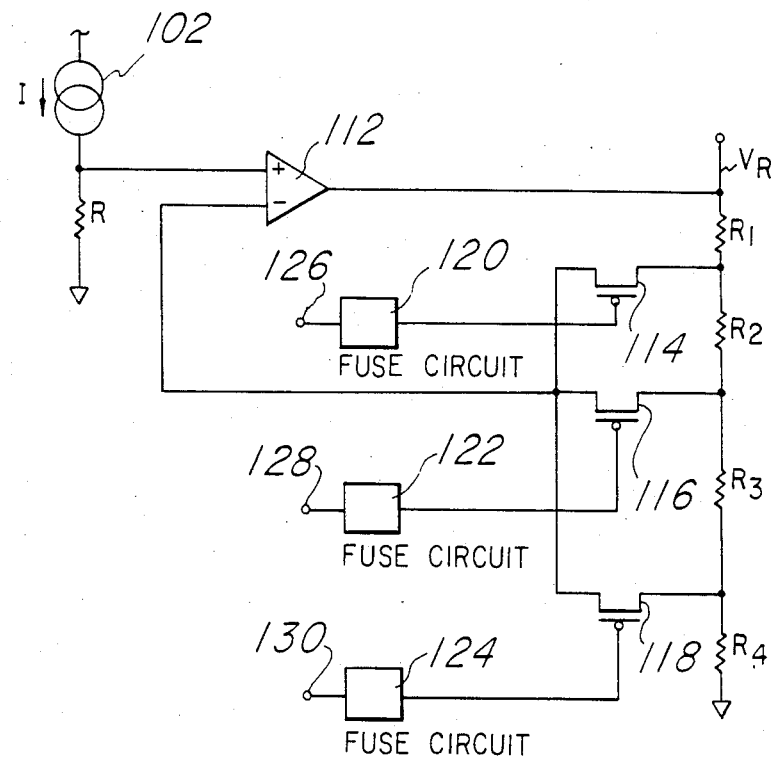
FIG. 2 is an application of the electrically programmable fuse circuit used to trim the voltage of a reference source.

An example of an application of the fuse circuit of FIG. 1 is shown in FIG. 2 in which a voltage reference $V_R$ is given the on-chip capability of being trimmed. In this case a current generator 102 of a standard type well known in the art generates a constant current I which develops a voltage IR across a resistor R. The latter voltage is fed into the non-inverting input of an operational amplifier 112 to develop an output voltage $V_R$. A fraction of the output voltage may be fed back to the inverting input in order to increase the voltage $V_R$ if required by programming any one of fuse circuits 120, 122 or 124 to turn on an associated one of P-channel transistors 114, 116 or 118. Each of fuse circuits 120, 122 and 124 have NSWRM inputs 126, 128 and 130, respectively. Each of fuse circuits 120, 122 and 124 correspond to the fuse circuit of FIG. 1 minus pass-gate transistor 39, which corresponds to each of transistors 114, 116 and 118. If, for example if the output voltage $V_R$ drops slightly due to a change in either current I or resistance value R, then a logic zero NSWRM control signal is applied to input 126 programming that fuse circuit. Following programming the output of fuse circuit 120 will now be normally low rather than high resulting in the turning on of transistor 114 and the application of the voltage drop across $R_1$ back to the inverting input of operational amplifier 112. In the event a greater correction is required the voltage drop across both $R_1$ and $R_2$ can be fed back to the inverting input by programming fuse circuit 122 rather than 120 or that across $R_1$, $R_2$, and $R_3$ can be fed back by programming fuse circuit 124 instead.

Other circuits which insert or take out components to trim parameters or to insert or remove bad rows or columns are arranged in a similar way.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A fuse circuit for an integrated circuit device, comprising:
   a non-volatile programmable memory element having two programmed states;
   a programming circuit coupled to said memory element for programming said memory element in response to a programming control signal;
   a read circuit coupled to said memory element for detecting the programmed state of said programming circuit and for generating a low voltage level for one of said two programmed states and a high voltage level for the other of said programmed states; and
   a pass transistor coupled to said read circuit switchable from an open to a closed condition in response to a change in output voltage level of said read circuit;
   wherein a NOR gate is used for forcing the output of said read circuit to zero in response to a SPOR input signal to said NOR gate;
   wherein said integrated circuit device includes a read line coupled to said read circuit through a read pass gate transistor which is turned off during a write or programming mode or in response to a SPOR signal being high; and
   wherein said read circuit includes a transistor coupled between supply voltage $V_{DD}$ and a read end of a source to a drain path of said read pass gate transistor and responsive to conduct on the opening of said read pass gate transistor.

2. A fuse circuit according to claim 1, wherein said read circuit includes a second transistor coupled between $V_{DD}$ and said read end and responsive to an increase in voltage on said read end to turn on and maintain said read end at $V_{DD}$.

3. A fuse circuit for an integrated circuit device, comprising:
   an electrically programmable read only memory cell;
   a programming circuit coupled to said memory cell for applying a predetermined voltage to a floating gate, a selection transistor gate and a floating gate transistor drain in response to a NSWRM control signal applied thereto;
   a read circuit coupled to said memory cell for detecting a programmed state of said memory cell and for generating a first voltage level for an unprogrammed state of said memory cell and a second voltage level for a programmed state of said memory cell; and
   a pass transistor coupled to said read circuit switchable from an open condition to a closed condition in response to a change in voltage level of an output of said read circuit;
   wherein said read circuit includes a pass gate transistor coupled to said read circuit and to said memory cell in the write or programming mode, includes a first transistor responsive to conduct on said pass gate transistor becoming non-conductive, includes a second transistor coupled between $V_{DD}$ supply voltage and said pass gate transistor responsive to conduct as long as either said pass gate transistor is conducting or, if not, said memory cell is non-conducting.

* * * * *